United States Patent
Liu et al.

(10) Patent No.: US 10,939,054 B2
(45) Date of Patent: Mar. 2, 2021

(54) ELIMINATING DIGITAL IMAGE ARTIFACTS CAUSED BY BACKLIGHTING

(71) Applicant: INTERNATIONAL BUSINESS MACHINES CORPORATION, Armonk, NY (US)

(72) Inventors: Su Liu, Austin, TX (US); Inseok Hwang, Austin, TX (US); Chungkuk Yoo, Austin, TX (US); Eric Rozner, Boulder, CO (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/202,311

(22) Filed: Nov. 28, 2018

(65) Prior Publication Data
US 2020/0169676 A1     May 28, 2020

(51) Int. Cl.
| | |
|---|---|
| *H04N 5/341* | (2011.01) |
| *G02F 1/1335* | (2006.01) |
| *G02B 5/20* | (2006.01) |
| *H01L 27/146* | (2006.01) |

(52) U.S. Cl.
CPC .............. *H04N 5/341* (2013.01); *G02B 5/20* (2013.01); *G02F 1/133528* (2013.01); *H01L 27/14603* (2013.01)

(58) Field of Classification Search
CPC ............. H04N 5/341; H01L 27/14603; G02F 1/133528; G02B 5/20
USPC ................................................. 348/294–324
See application file for complete search history.

(56) References Cited

U.S. PATENT DOCUMENTS

| | | |
|---|---|---|
| 5,258,607 A | 11/1993 | Agostini et al. |
| 5,305,012 A | 4/1994 | Faris |
| 5,351,151 A | 9/1994 | Levy |
| 5,619,228 A | 4/1997 | Doherty |
| 6,786,610 B2 | 9/2004 | Faris |
| 7,134,707 B2 | 11/2006 | Issac |
| 7,295,233 B2 | 11/2007 | Steinberg et al. |

(Continued)

FOREIGN PATENT DOCUMENTS

DE     102017006781     1/2018

OTHER PUBLICATIONS

Brock et al., "A pixelated polarizer-based camera for instantaneous interferometric measurements", https://www.4dtechnology.com/library/A-pixelated-polarizer-based-camera-for-instantaneous-interferometric-SPIE-8160-32.pdf, Accessed Nov. 19, 2018, 9 pages.

(Continued)

*Primary Examiner* — Yogesh K Aggarwal
(74) *Attorney, Agent, or Firm* — Noah Sharkan; Andrew D. Wright; Roberts Calderon Safran & Cole, P.C.

(57) ABSTRACT

A method includes: receiving light at an image sensor of a digital camera; generating an image based on the received light; detecting an artifact in the image; determining a blocking area of the sensor based on the detecting the artifact; blocking the light at the blocking area; determining whether the artifact is present in the image after the blocking; in response to determining that the artifact is present after the blocking, determining a new blocking area and repeating the blocking and the determining using the new blocking area; and in response to determining that the artifact is not present after the blocking, saving the image in memory.

20 Claims, 3 Drawing Sheets

(56) References Cited

U.S. PATENT DOCUMENTS

| | | | |
|---|---|---|---|
| 7,920,723 | B2 | 4/2011 | Nanu et al. |
| 7,982,807 | B2 | 7/2011 | Chen |
| 8,508,646 | B2 | 8/2013 | Katerberg |
| 8,957,990 | B2 | 2/2015 | Seo et al. |
| 2002/0088927 | A1 | 7/2002 | Simchoni |
| 2004/0012762 | A1 | 1/2004 | Faris |
| 2006/0196613 | A1 | 9/2006 | Lamontagne et al. |
| 2007/0126255 | A1 | 6/2007 | Mitsui |
| 2011/0157419 | A1* | 6/2011 | Nayar .................... H04N 5/235 348/229.1 |
| 2011/0221933 | A1 | 9/2011 | Yuan et al. |
| 2018/0130431 | A1 | 5/2018 | Hwang et al. |

OTHER PUBLICATIONS

Llordes et al., "Tunable near-infrared and visible-light transmittance in nanocrystal-in-glass composites", https://www.nature.com/articles/nature12398, Nature, Aug. 15, 2013, 8 pages.

Goodner, "New "smart window" material selectively blocks light and/or heat", New Atlas, https://newatlas.com/smart-window-selectively-block-light-heat/38593/, Jul. 24, 2015, 3 pages.

Anonymous, "A Smart Glare / Blinding Protection Device for Blocking a Glaring Source With Minimal Interference of the Visual Field", ip.com, Jul. 23, 2014, 4 pages.

Chin et al., "Detection and Compensation Algorithm for Backlight Images With Fuzzy Logic and Adaptive Compensation Curve" International Journal of Pattern Recognition and Artificial Intelligence, vol. 19, No. 8, 2005, 18 pages.

Kriegel et al., "Tunable light filtering by a Bragg mirror/heavily doped semiconducting nanocrystal composite", Beilstein Journal of Nanotechnology, Jan. 16, 2015, 8 pages.

Fujikake et al., "Video camera system using liquid-crystal polarizing filter to reduce reflected light", IEEE Transactions on Broadcasting 44(4):419-426, https://www.researchgate.net/publication/3040848_Video_camera_system_using_liquid-crystal_polarizing_filter_to_reduce_reflected_light, Jan. 1999, 1 pages.

\* cited by examiner

ELIMINATING DIGITAL IMAGE ARTIFACTS CAUSED BY BACKLIGHTING

BACKGROUND

The present invention relates generally to digital cameras and, more particularly, to systems and methods for eliminating digital image artifacts caused by backlighting.

Digital photography is a popular pastime for many people. Digital photography is becoming increasingly accessible with the advent of smartphones and technological advances that reduce the price of other digital cameras.

SUMMARY

In a first aspect of the invention, there is a computer-implemented method including: receiving light at an image sensor of a digital camera; generating an image based on the received light; detecting an artifact in the image; determining a blocking area of the sensor based on the detecting the artifact; blocking the light at the blocking area; determining whether the artifact is present in the image after the blocking; in response to determining that the artifact is present after the blocking, determining a new blocking area and repeating the blocking and the determining using the new blocking area; and in response to determining that the artifact is not present after the blocking, saving the image in memory.

In another aspect of the invention, there is digital camera comprising: an image sensor; a filter; and a processor that is configured to: generate an image based on light received at the image sensor; detect an artifact in the image; determine a blocking area in response to the detecting the artifact; control the filter to block the light at a portion of the image sensor corresponding to the blocking area; and incrementally increase a size of the blocking area and repeat the controlling the filter, to block the light at a portion of the image sensor corresponding to the increased blocking area, until the artifact is eliminated from the image.

In another aspect of the invention, there is a computer program product including a computer readable storage medium having program instructions embodied therewith. The program instructions are executable by a computer device to cause the computer device to: generate an image based on light received at an image sensor; detect an artifact in the image; determine a blocking area in response to detecting the artifact; control a filter to block the light at a portion of the image sensor corresponding to the blocking area; and incrementally increase a size of the blocking area and repeat the controlling the filter, to block the light at a portion of the image sensor corresponding to the increased blocking area, until the artifact is eliminated from the image.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1:
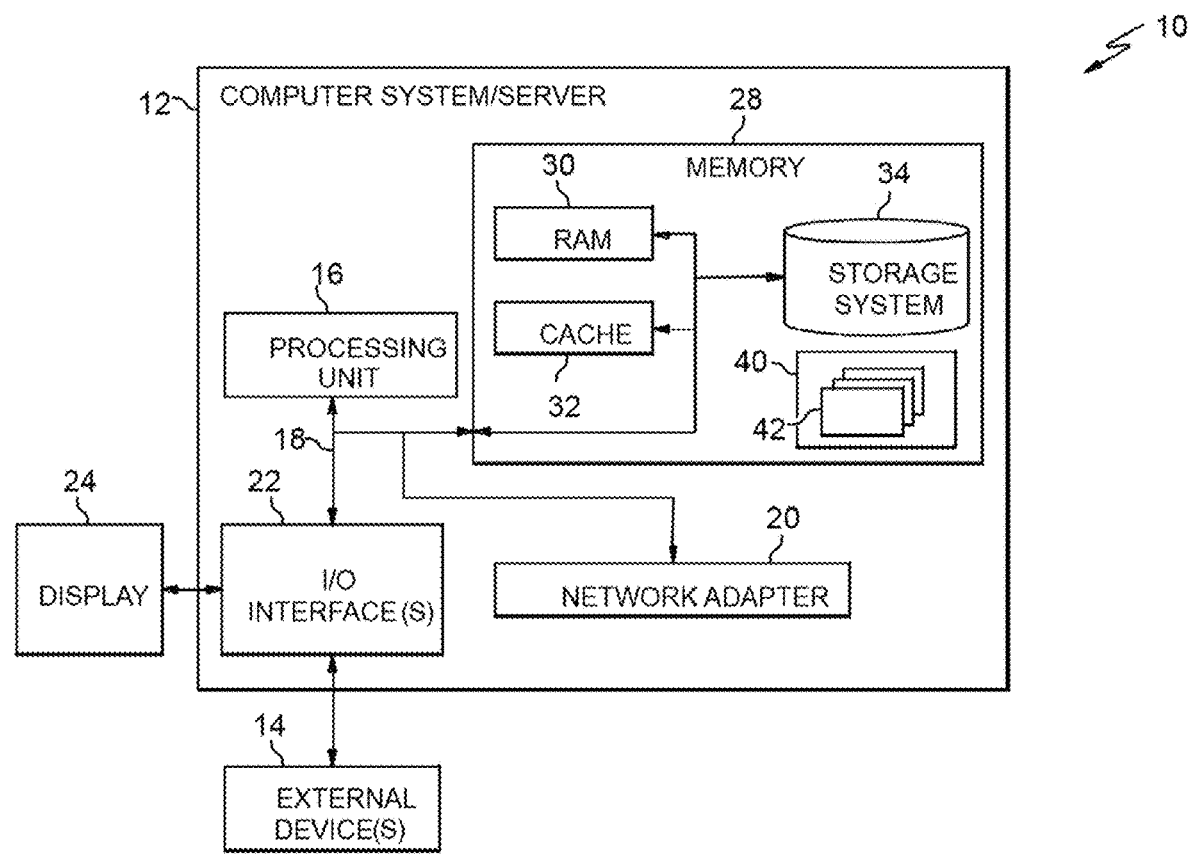
FIG. 1 depicts a computer infrastructure according to an embodiment of the present invention.

The present invention relates generally to digital cameras and, more particularly, to systems and methods for eliminating artifacts caused by backlighting in digital camera images. Aspects of the invention are directed to detecting a light source that causes an artifact in a digital image, selectively blocking an area of the image sensor at a central location of the light source, and incrementally increasing a size of the blocked area until the artifact is eliminated from the image.

Photographing towards backlight sources often creates artifacts in the captured digital image. These artifacts are typically unwanted by the user taking the photograph. Such artifacts can include blooming effects in which excessive photons impinge an image sensor pixel, and excessive charges are produced at the pixel thus overflowing to neighboring pixels. Blooming causes blurs around edges of objects. Backlight generated artifacts can also include lens glare effects in which there are multiple light paths created by reflections and refractions through internal lens structure, causing multiple blobs overlaid on the scene. Backlight generated artifacts can also include starburst effects in which diffraction through aperture blades causes multiple rays spreading outward from the light source, overlaying the scene in the image. Backlight generated artifacts can also include smear effects that are caused by shift registers of an image sensor that performs charge transfer, and that result in streaks stemming from the light source, overlaying the scene in the image. Moreover, for applications requiring accurate, undistorted images with all the details preserved, backlighting can disadvantageously affect home security cameras and autonomous vehicles using computer vision.

To address these problems, implementations of the invention provide a method and system to selectively mask the backlit segment from the incoming scene in a digital image, so that the backlight does not reach the optical system or the image sensor, while the other objects including ones in front of the backlight sources remain visible. In accordance with aspects of the invention, a dynamically reconfigurable filter is placed in front of the optical system of a digital camera. In embodiments, the filter is capable of controlling the passage of light at individual pixel level. In embodiments, the filter is controlled to block the passage of light at individual pixels of the image sensor, while letting light pass unimpeded to other pixels of the image sensor. In embodiments, a backlight detection algorithm is continuously running and processes the image frames one after another to identify a backlit area (a.k.a. clusters of pixels) of an image generated from light received at the image sensor. In embodiments, the system identifies pixels of the image sensor that are receiving the light from the backlight source, and controls corresponding pixels (or other units) of the filter to block the light impinging on the identified pixels of the image sensor. In embodiments, for dynamically changing scenes, the system repeats the steps continuously to keep the backlit segments updated.

Aspects of the invention utilize a controllable polarization filter for a camera that can selectively block incoming light to mask backlit portions of an image. For example, if an in-frame image is a person with the sun behind them and over their shoulder, the polarization filter would be controlled to increase opacity of the filter in the regions around the person, thereby blocking light received by the image sensor, to mask the regions of the frame having the source of the backlighting while keeping unmasked the region of the frame in which the person is standing. In an aspect of the invention, there is a system and method for an intelligent anti-backlight camera using localized polarization to selectively block incoming light and mask backlit portions of an image, comprising: providing a camera comprising an image sensor and a polarization filter (e.g., a filter comprised of nanocrystal, micro blinds, smart glass, OLED panels, etc.) disposed in front of the image sensor, where the polarization filter can be selectively controlled (e.g., at a pixel resolution) to block incoming light from reaching the image sensor; analyzing a frame of a digital image to identify backlit regions of the frame; and controlling the polarization filter (e.g., at a pixel resolution) to mask the backlit regions of the frame while keeping unmasked the region of the frame having the object in front of the backlight source.

As described herein, aspects of the invention involve dynamic filtering of a core backlight source that is causing artifacts in a digital image. Aspects of the invention distinguish the core backlight source from the optical artifacts such as smear, starburst, blooming, and flare. Those optical artifacts occur due to certain components commonly existing in optical systems, such as the aperture, shift registers of the image sensor, multi-layer lenses, and the upper bound charges that an image sensor can accumulate. Those optical artifacts create excessively bright regions in the outer area of the backlight source. Aspects of the invention precisely filter only the core backlight source, thereby minimizing the filtering area while eliminating the optical artifacts. In this manner, implementations of the invention provide minimal-area filtering that advantageously ensures a user's field of view remains as large as possible.

Embodiments of the invention improve the technology of digital photography by providing users with automated tools that eliminate artifacts that are caused by backlit scenes. Embodiments of the invention employ an unconventional arrangement of steps including: generating an image based on light received at an image sensor; detecting an artifact in the image; determining a blocking area in response to detecting the artifact; controlling a filter to block the light at a portion of the image sensor corresponding to the blocking area; and incrementally increasing a size of the blocking area and repeat the controlling the filter, to block the light at a portion of the image sensor corresponding to the increased blocking area, until the artifact is eliminated from the image. The steps themselves are unconventional, and the combination of the steps is also unconventional. Moreover, aspects of the method are carried out using particular machines, including a digital camera and a filter that blocks light at a portion of the image sensor of the digital camera.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to FIG. 1, a schematic of an example of a computer infrastructure is shown. Computer infrastructure 10 is only one example of a suitable computer infrastructure and is not intended to suggest any limitation as to the scope of use or functionality of embodiments of the invention described herein. Regardless, computer infrastructure 10 is capable of being implemented and/or performing any of the functionality set forth hereinabove.

In computer infrastructure 10 there is a computer system 12, which is operational with numerous other general purpose or special purpose computing system environments or configurations. Examples of well-known computing systems, environments, and/or configurations that may be suitable for use with computer system 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 12 may be described in the general context of computer system executable instructions, such as program modules, being executed by a computer system. Generally, program modules may include routines, programs, objects, components, logic, data structures, and so on that perform particular tasks or implement particular abstract data types. Computer system 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system 12 in computer infrastructure 10 is shown in the form of a general-purpose computing device. The components of computer system 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 12 typically includes a variety of computer system readable media. Such media may be any available media that is accessible by computer system 12, and it includes both volatile and non-volatile media, removable and non-removable media.

System memory 28 can include computer system readable media in the form of volatile memory, such as random access memory (RAM) 30 and/or cache memory 32. Computer system 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 12 may also communicate with one or more external devices 14 such as a keyboard, a pointing device, a display 24, etc.; one or more devices that enable a user to interact with computer system 12; and/or any devices (e.g., network card, modem, etc.) that enable computer system 12 to communicate with one or more other computing devices. Such communication can occur via Input/Output (I/O) interfaces 22. Still yet, computer system 12 can communicate with one or more networks such as a local area network (LAN), a general wide area network (WAN), and/or a public network (e.g., the Internet) via network adapter 20. As depicted, network adapter 20 communicates with the other components of computer system 12 via bus 18. It should be understood that although not shown, other hardware and/or software components could be used in conjunction with computer system 12. Examples, include, but are not limited to: microcode, device drivers, redundant processing units, external disk drive arrays, RAID systems, tape drives, and data archival storage systems, etc.

Figure 2:
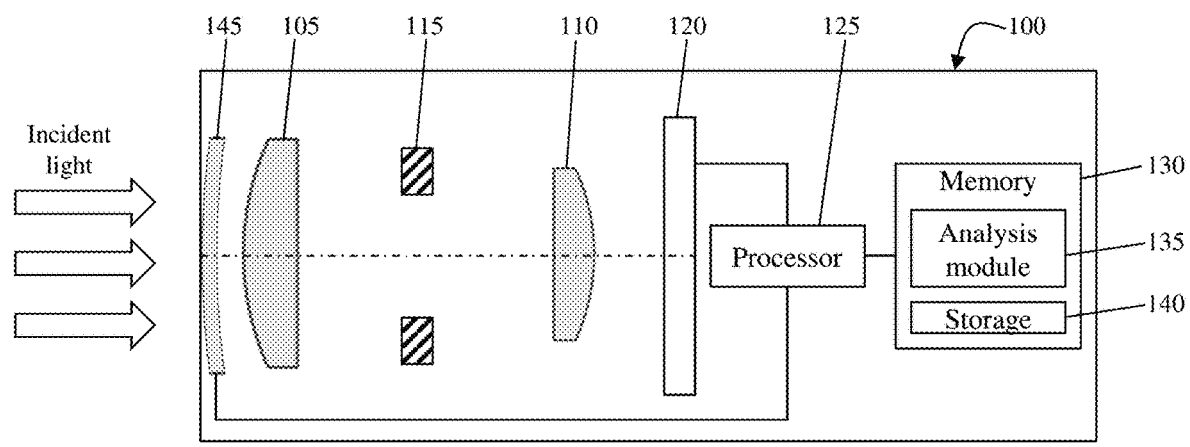
FIG. 2 shows a block diagram of an exemplary environment in accordance with aspects of the invention.

FIG. 2 shows a block diagram of an exemplary system in accordance with aspects of the invention. In embodiments, the system includes a camera 100 comprising one or more optical lenses 105, 110, an aperture 115, an image sensor 120, a computer processor 125, and a computer memory 130. The camera 100 is any desired type of digital camera including, but not limited to, a smartphone, a digital single-lens reflex camera, and a digital point-and-shoot camera. In embodiments, the camera 100 comprises one or more elements of the computer system 12 of FIG. 1, including the processor 125 and memory 130. The camera 100 may also comprise other elements that are not shown, including a shutter, rechargeable battery, display screen, wireless communication system, etc.

In embodiments, the sensor 120 is a digital camera image sensor that comprises an array of individual units (e.g., pixels). For example, the sensor 120 may comprise a charge-coupled device (CCD) image sensor or a complementary metal-oxide-semiconductors (CMOS) image sensor. The sensor 120 may comprise a single image sensor or plural image sensors that cooperate to capture an image.

In operation, the lenses 105, 110 focus incident light onto the sensor 120. Individual pixels of the sensor 120 generate discrete output signals based on the light that impinges upon them. The processor 125 receives the output signals from the sensor 120 and processes the output signals to generate a digital image that can be displayed on a display screen and/or saved in the memory 130 (e.g., in a storage 140 portion of the memory 130).

According to aspects of the invention, the camera 100 includes a filter 145 that is configured to selectively filter light that impinges upon the sensor 120. In embodiments, the filter 145 is in front of the outermost lens 105 such that incident light passes through the filter 145 prior to passing through any of the lenses 105, 110. The filter 145 is not limited to this one location, however, and instead may be arranged at any location prior to the sensor 120 so that it can selectively filter light impinging on the sensor 120.

In accordance with aspects of the invention, the filter 145 is operatively connected to the processor 125, and the processor 125 is configured to selectively activate discrete portions of the filter 145 to filter light that is incident on individual pixels of the sensor 120. In this manner, the filter 145 is leveraged to provide selective filtering of individual pixels of the sensor 120. In embodiments, the processor 125 is configured to control the filter 145 to block light at plural pixels of the sensor 120 simultaneously, wherein the plural pixels are a subset of all the pixels of the sensor 120.

Numerous types of technology may be used for the filter 145 in accordance with aspects of the invention. In one example, the filter 145 comprises smart glass such as a liquid crystal display (LCD) element or an organic light-emitting diode (OLED) element that is normally optically transparent, and which the processor 125 controls to selectively activate certain ones of the pixels (of the display) to block incident light passing through those pixels toward the sensor. In another example, the filter 145 comprises an LCD or OLED element sandwiched between first and second polarizer films, which the processor 125 controls to selectively activate certain ones of the pixels (of the display) to block incident light passing through those toward the sensor. In another example, the filter 145 comprises a layer of nanocrystals (e.g., a Bragg mirror and a layer of plasmonic semiconductor nanocrystals), which the processor 125 controls to selectively activate certain ones of the nanocrystals to block incident light passing through those nanocrystals toward the sensor. In another example, the filter 145 comprises an array of microblinds (e.g., physical light-blocking structures that are actuated by electrostatic force between a curled configuration and a deployed configuration), which the processor 125 controls to selectively activate certain ones of the microblinds to block incident light passing through those microblinds toward the sensor. As used herein, blocking the light refers to completely blocking the light (e.g., 100% opacity) or partially blocking the light (opacity greater than 0% and less than 100%).

In embodiments, the memory 130 stores an analysis module 135 that is executed by the processor 125 and that is configured to perform functions described herein. In embodiments, the analysis module 135 comprises one or more program modules such as program modules 42 as described with respect to FIG. 1. According to aspects of the invention, the analysis module 135 is configured to: analyze the outputs of pixels of the sensor 120 to detect a light source that causes an artifact in a digital image; cause the processor 125 to control the filter 145 to selectively block an area of the sensor 120 at a central location of the detected light source; determine whether blocking the area eliminates the artifact from the digital image; and incrementally increase a size of the blocked area until the artifact is eliminated from the digital image.

Figure 3A:
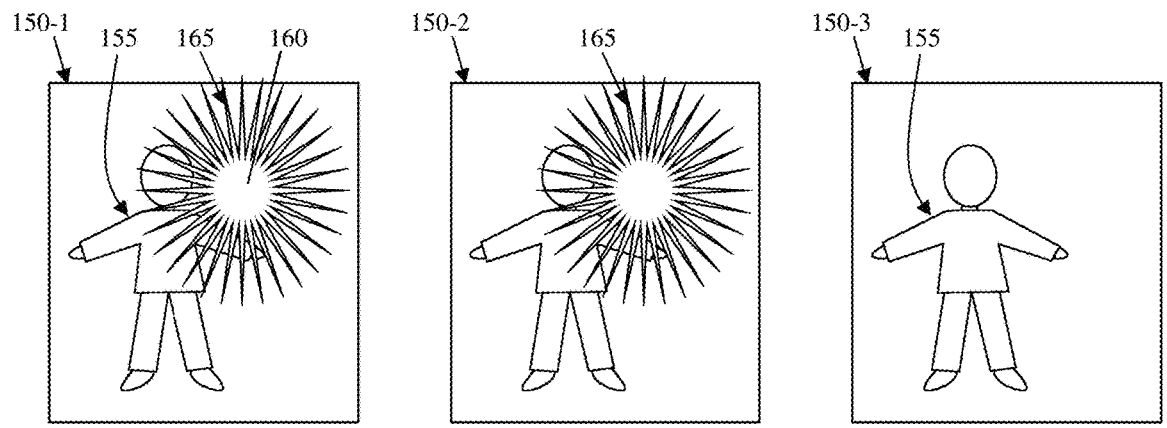
FIGS. 3A-C depict an exemplary use case in accordance with aspects of the invention.
Figure 3A:
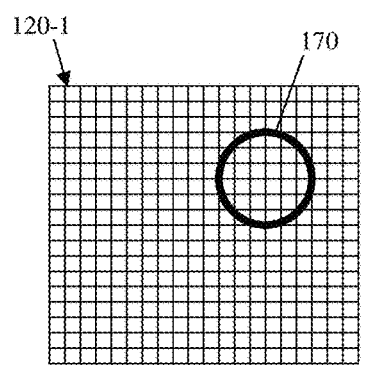
Figure 3B:
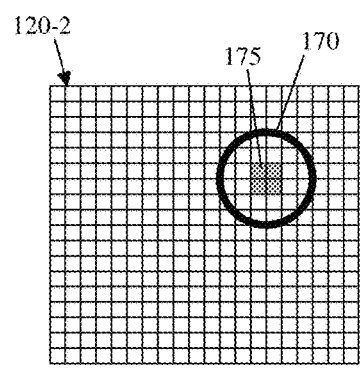
Figure 3C:
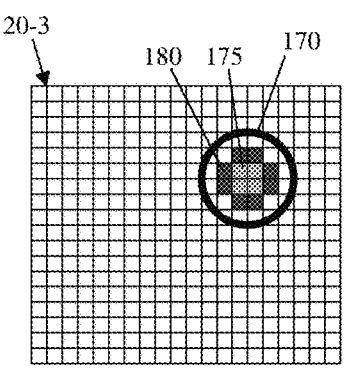

FIGS. 3A-C depict an exemplary use case in accordance with aspects of the invention. FIGS. 3A-C show a pixel array of the image sensor (image sensor 120 of FIG. 2) and an image captured by the image sensor at three different times. In particular, FIG. 3A shows a pixel array 120-1 (e.g., of the image sensor 120 of FIG. 2) and a resultant digital image 150-1 generated by the processor 125 as a result of the output of the pixel array 120-1 at a first time t1. FIG. 3B shows the pixel array 120-2 and a resultant digital image 150-2 generated by the processor 125 as a result of the output of the pixel array 120-2 at a second time t2 after t1. FIG. 3C shows the pixel array 120-3 and a resultant digital image 150-2 generated by the processor 125 as a result of the output of the pixel array 120-3 at a third time t3 after t2.

As shown in FIG. 3A, the image 150-1 includes a subject 155 and a light source 160 that creates an artifact 165. In this example, the light source 160 is backlight and the artifact 165 is a starburst, although aspects of the invention are not limited to backlight and starburst artifacts. As shown in FIG. 3A, the artifact 165 obscures the subject 155 in the image 150-1, resulting in an unwanted visible effect in the digital image.

Still referring to FIG. 3A, according to aspects of the invention, the analysis module 135 analyzes the image 150-1 to detect the presence of the light source 160 and the artifact 165. In embodiments, the analysis module 135 is programmed with one or more image analysis routines that are configured to detect plural different types of artifacts, including starburst, lens flare, blooming, and smear. In embodiments, the analysis module 135 is programmed with one or more image analysis routines are configured to determine an area 170 of the pixel array 120-1 that corresponds to the light source 160 that causes the artifact 165.

As shown in FIG. 3B, in accordance with aspects of the invention, the analysis module 135 determines a central location of the area 170 and determines a blocking area comprising at least one pixel 175 at the central location, wherein an area of the at least one pixel 175 is less than the area 170. In embodiments, the analysis module 135 controls one or more portions of the filter 145 (e.g., via one or more control signals generated by the processor 125) to cause these portions of the filter 145 to block the light that is incident on the determined pixels 175 of the pixel array 120-2. In embodiments, the memory 130 stores data that defines a correspondence between individual portions of the filter 145 and individual pixels of the sensor 120, and the analysis module 135 uses this data to determine the portions of the filter 145 that correspond to the determined pixels 175 as shown in FIG. 3B.

According to aspects of the invention, after controlling the filter 145 to block light that is incident on the pixels 175, the analysis module 135 analyzes the image 150-2 to determine whether the artifact 165 is still present in the image. In the example shown in FIG. 3B, blocking the light that is incident on the pixels 175 does not eliminate the artifact 165 from the image.

According to aspects of the invention, based on determining that blocking the light that is incident on the blocking area (e.g., the pixels 175) does not eliminate the artifact 165 from the image, the analysis module 135 increases the size of the blocking area to include more pixels of the sensor. For example, as shown in FIG. 3C, the analysis module 135 determines a new (larger) blocking area that includes pixels 175 and pixels 180, and controls the filter 145 to block light that is incident on the new blocking area. With continued reference to FIG. 3C, after controlling the filter 145 to block light that is incident on the new blocking area (e.g., pixels 175 and pixels 180 in this example), the analysis module 135 analyzes the image 150-3 to determine whether the artifact 165 is still present in the image 150-3. In the example shown in FIG. 3C, blocking the light that is incident on the pixels 175 and pixels 180 does eliminate the artifact 165 from the image 150-3. According to aspects of the invention, based on determining that blocking the light eliminates the artifact 165 from the image, the analysis module 135 deems the image as being corrected saves the image (e.g., image 150-3) in the storage 140, after which the user may access the stored image in any conventional or later developed manner.

As described herein, implementations of the invention determine an initial blocking area that is smaller in size than the determined area 170 of the light source on the image sensor 120. In embodiments, the system then gradually increases the size of the blocking area until the artifact 165 disappears from the image. In this manner, implementations of the invention avoid overcorrecting the image, which can produce unwanted results in the image.

In an embodiment, the system incrementally increases the size of the blocking area until a measured parameter falls below a threshold value. In one example, the parameter is an intensity of a peripheral area immediately adjacent to the blocking area. In this embodiment, the analysis module 135 compares the intensity of light at the pixels around the blocking area to a defined threshold value (e.g., stored in the memory 130). If the intensity is greater than the threshold, then the analysis module 135 increases the blocking area and then checks again. If the intensity is less than the threshold value, then the analysis module 135 deems the image as being corrected and saves the image in the memory.

Figure 4:
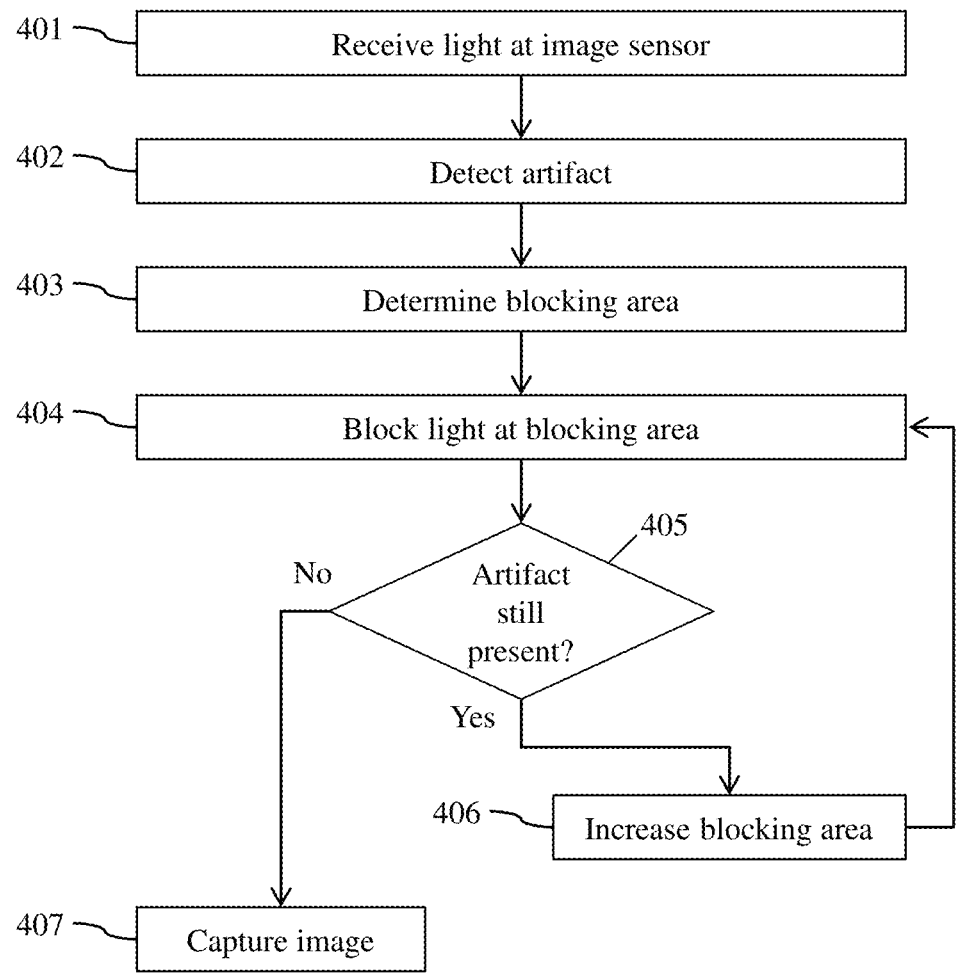
FIG. 4 shows a flowchart of an exemplary method in accordance with aspects of the invention.

FIG. 4 shows a flowchart of an exemplary method in accordance with aspects of the present invention. Steps of the method may be carried out in the system of FIG. 2 and are described with reference to elements depicted in FIG. 2.

At step 401, the system receives light at an image sensor. In embodiments, and as described with respect to FIGS. 2 and 3A, light passes through lenses 105 and 110 and impinges on pixels of the sensor 120. In embodiments, the processor 125 generates a digital image based on the light received by the sensor.

At step 402, the system detects an artifact in the image (from step 401). In embodiments, and as described with respect to FIGS. 2 and 3A, the analysis module 135 analyzes the digital image to detect an artifact 165 in the image.

At step 403, the system determines a blocking area. In embodiments, and as described with respect to FIGS. 2 and 3A, the analysis module 135 determines an area 170 of the pixel array that corresponds to a light source 160 that causes the artifact 165 that was detected at step 402. The analysis module 135 then determines a central location of the area 170 and determines a blocking area comprising at least one pixel of the sensor 120 at the central location. According to aspects of the invention, the blocking area is smaller than the than the area 170.

At step 404, the system blocks light at the blocking area (determined at step 403). In embodiments, and as described with respect to FIGS. 2 and 3B, the analysis module 135 controls one or more portions of the filter 145 to block the light that is incident on the blocking area (e.g., pixels 175 as indicated in FIG. 3B). As described herein, blocking the light refers to completely blocking the light (e.g., 100% opacity) or partially blocking the light (opacity greater than 0% and less than 100%) is incident on the pixels of the determined blocking area.

At step 405, the system determines whether the artifact (determined at step 402) is still present in the image while the blocking (of step 404) is being performed. If the artifact is still present in the image, then at step 406 the analysis module 135 increases the size of the blocking area and the process returns to step 404. If the artifact is not still present in the image, then at step 407 the analysis module 135 deems the image as corrected and saves the image in the camera memory.

In embodiments, a service provider could offer to perform the processes described herein. In this case, the service provider can create, maintain, deploy, support, etc., the computer infrastructure that performs the process steps of the invention for one or more customers. These customers may be, for example, any business that uses technology. In return, the service provider can receive payment from the customer(s) under a subscription and/or fee agreement and/or the service provider can receive payment from the sale of advertising content to one or more third parties.

In still additional embodiments, the invention provides a computer-implemented method, via a network. In this case, a computer infrastructure, such as computer system 12 (FIG. 1), can be provided and one or more systems for performing the processes of the invention can be obtained (e.g., created, purchased, used, modified, etc.) and deployed to the computer infrastructure. To this extent, the deployment of a system can comprise one or more of: (1) installing program code on a computing device, such as computer system 12 (as shown in FIG. 1), from a computer-readable medium; (2) adding one or more computing devices to the computer infrastructure; and (3) incorporating and/or modifying one or more existing systems of the computer infrastructure to enable the computer infrastructure to perform the processes of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    receiving light at an image sensor of a digital camera;
    generating an image based on the received light;
    detecting an artifact in the image;
    determining a blocking area of the sensor based on the detecting the artifact;
    blocking the light at the blocking area;
    determining whether the artifact is present in the image after the blocking;
    in response to determining that the artifact is present after the blocking, determining a new blocking area and repeating the blocking and the determining using the new blocking area; and
    in response to determining that the artifact is not present after the blocking, saving the image in memory,
    wherein the image sensor comprises a pixel array;
    the determining the blocking area comprises determining an area of the pixel array that corresponds to a light source that causes the artifact;
    the blocking area is smaller than the area of the pixel array that corresponds to the light source that causes the artifact; and
    the determining the blocking area comprises: determining a central location of the area of the pixel array that corresponds to the light source that causes the artifact; and determining at least one pixel of the pixel array at the central location.

2. The method of claim 1, wherein the new blocking area is larger than the blocking area.

3. The method of claim 2, wherein the new blocking area comprises the at least one pixel and other pixels adjacent to the at least one pixel.

4. The method of claim 1, wherein the blocking the light at the blocking area comprises controlling a filter to block the light at the at least one pixel.

5. The method of claim 1, wherein:
    the artifact is caused by backlighting; and
    the artifact comprises a starburst.

6. A digital camera, comprising:
    a first lens and a seconds lens;
    an aperture between the first lens and the second lens;
    an image sensor, wherein the second lens is between the aperture and the image sensor;
    a filter, wherein the first lens is between the filter and the aperture; and
    a processor that is configured to:
        generate an image based on light received at the image sensor;
        detect an artifact in the image;
        determine a blocking area in response to the detecting the artifact;
        control the filter to block the light at a portion of the image sensor corresponding to the blocking area; and
        incrementally increase a size of the blocking area and repeat the controlling the filter, to block the light at a portion of the image sensor corresponding to the increased blocking area, until the artifact is eliminated from the image.

7. The digital camera of claim 6, wherein:
    the image sensor comprises a pixel array;
    the determining the blocking area comprises determining an area of the pixel array corresponding to a light source that causes the artifact; and
    the blocking area is smaller than the determined area of the pixel array corresponding to the light source that causes the artifact.

8. The digital camera of claim 7, wherein the determining the blocking area comprises:
    determining a central location of the determined area of the pixel array corresponding to the light source that causes the artifact; and
    determining at least one pixel of the pixel array at the central location.

9. The digital camera of claim 8, wherein the controlling the filter comprises causing a portion of the filter to block the light at the at least one pixel of the pixel array.

10. The digital camera of claim 6, wherein:
    the artifact is caused by backlighting; and
    the artifact comprises a starburst.

11. The digital camera of claim 6, wherein the digital camera comprises one selected from the group consisting of: a smartphone; a digital single-lens reflex camera; and a digital point-and-shoot camera.

12. The digital camera of claim 6, wherein the filter comprises a liquid crystal display (LCD) element sandwiched between first and second polarizer films which the processor controls to selectively activate certain pixels of the LCD element to block incident light passing through the certain pixels of the LCD element.

13. The digital camera of claim 6, wherein the filter comprises an organic light-emitting diode (OLED) element sandwiched between first and second polarizer films which the processor controls to selectively activate certain pixels of the OLED element to block incident light passing through the certain pixels of the OLED element.

14. The digital camera of claim 6, wherein the filter comprises a layer of nanocrystals which the processor controls to selectively activate certain ones of the nanocrystals to block incident light passing through the certain ones of the nanocrystals.

15. The digital camera of claim 6, wherein:
    the filter comprises microblinds which the processor controls to selectively activate certain ones of the microblinds to block incident light passing through the certain ones of the microblinds; and
    the microblinds comprise physical light-blocking structures that are actuated by electrostatic force between a curled configuration and a deployed configuration.

16. The digital camera of claim 6, wherein:
    the incrementally increasing the size of the blocking area is repeated until a measured parameter falls below a threshold value;

the parameter is an intensity of light in a peripheral area immediately adjacent to the blocking area;

the processor is configured to compare intensity of light at pixels in the peripheral area to the threshold value;

the processor is configured to increase the size of the blocking area in response to determining the intensity of light at the pixels in the peripheral area is greater than the threshold value; and the processor is configured to deem the image as being corrected and save the image in memory in response to determining the intensity of light at the pixels in the peripheral area is less than the threshold value.

17. A computer program product, the computer program product comprising a computer readable storage medium having program instructions embodied therewith, the program instructions executable by a computer device to cause the computer device to:

generate an image based on light received at an image sensor;

detect an artifact in the image;

determine a blocking area in response to detecting the artifact;

control a filter to block the light at a portion of the image sensor corresponding to the blocking area; and incrementally increase a size of the blocking area and repeat the controlling the filter, to block the light at a portion of the image sensor corresponding to the increased blocking area, until the artifact is eliminated from the image, wherein the image sensor comprises a pixel array;

the determining the blocking area comprises determining an area of the pixel array corresponding to a light source that causes the artifact;

the blocking area is smaller than the determined area of the pixel array corresponding to the light source that causes the artifact; and the determining the blocking area comprises: determining a central location of the determined area of the pixel array corresponding to the light source that causes the artifact; and determining at least one pixel of the pixel array at the central location.

18. The computer program product of claim 17, wherein the controlling the filter comprises causing a portion of the filter to block the light at the at least one pixel of the pixel array.

19. The computer program product of claim 17, wherein the filter comprises one selected from the group consisting of: smart glass; a liquid crystal display element or an organic light-emitting diode (OLED) element sandwiched between first and second polarizer films; nanocrystals; and microblinds.

20. The computer program product of claim 17, wherein:

the artifact is caused by backlighting; and the artifact comprises at one selected from the group consisting of: starburst, lens flare, blooming, and smear.

* * * * *